(12) United States Patent
Kienzle et al.

(10) Patent No.: US 6,967,328 B2
(45) Date of Patent: Nov. 22, 2005

(54) METHOD FOR THE ELECTRON-MICROSCOPIC OBSERVATION OF A SEMICONDUCTOR ARRANGEMENT AND APPARATUS THEREFOR

(75) Inventors: Oliver Kienzle, Aalen (DE); Rainer Knippelmeyer, Aalen (DE); Ingo Müller, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 94 days.

(21) Appl. No.: 10/614,825

(22) Filed: Jul. 9, 2003

(65) Prior Publication Data

US 2004/0065827 A1 Apr. 8, 2004

(30) Foreign Application Priority Data

Jul. 9, 2002 (DE) .......................................... 102 30 929

(51) Int. Cl.⁷ ............................................. G01N 23/00
(52) U.S. Cl. .................... 250/310; 250/492.2; 382/145; 382/149
(58) Field of Search ............................. 250/310, 492.2; 382/145, 149

(56) References Cited

U.S. PATENT DOCUMENTS

| | | | |
|---|---|---|---|
| 4,376,249 A | 3/1983 | Pfeiffer et al. | |
| 4,740,704 A | 4/1988 | Rose et al. | |
| 5,118,941 A | 6/1992 | Larson | |
| 5,302,828 A | 4/1994 | Monahan | |
| 5,412,209 A | 5/1995 | Otaka et al. | |
| 5,412,210 A | 5/1995 | Todokoro et al. | |
| 5,493,116 A | 2/1996 | Toro-Lira et al. | |
| 5,973,323 A | 10/1999 | Adler et al. | |
| 6,066,849 A | 5/2000 | Masnaghetti et al. | |
| 6,091,249 A | 7/2000 | Talbot et al. | |
| 6,232,787 B1 | 5/2001 | Lo et al. | |
| 6,259,094 B1 * | 7/2001 | Nagai et al. | 250/310 |
| 6,373,054 B2 | 4/2002 | Hiroi et al. | |
| 6,646,262 B1 * | 11/2003 | Todokoro et al. | 250/310 |
| 2002/0084422 A1 | 7/2002 | Kienzle et al. | |
| 2002/0100872 A1 * | 8/2002 | Hiroi et al. | 250/310 |
| 2003/0066961 A1 | 4/2003 | Kienzle et al. | |

FOREIGN PATENT DOCUMENTS

| | | |
|---|---|---|
| DE | 100 44 199 A1 | 6/2002 |
| DE | 101 31 931 A1 | 1/2003 |
| EP | 0 218 920 A2 | 4/1987 |
| EP | 0 810 629 A1 | 12/1997 |
| WO | WO 99/23684 A1 | 5/1999 |
| WO | WO 00/72355 A1 | 11/2000 |
| WO | WO 01/88514 A1 | 11/2001 |

OTHER PUBLICATIONS

Hansheng Guo et al., "Charging Phenomena and Charge Compensation in AES on Metal Oxides and Silica," Surface and Interface Analysis, vol. 25, pp. 390–396 (1997), John Wiley & Sons, Ltd.

(Continued)

*Primary Examiner*—Nikita Wells
*Assistant Examiner*—Zia R. Hashmi
(74) *Attorney, Agent, or Firm*—Jones Day

(57) ABSTRACT

A method for the electron-microscopic observation of a semiconductor arrangement is provided. It includes providing an electron microscopy optics for imaging secondary electrons emanating from the semiconductor arrangement within an extended object field on a position-sensitive detector, providing an illumination device for emitting a primary energy beam, directing the primary energy beam to at least the object field for extracting there secondary electrons from the semiconductor arrangement. The semiconductor arrangement comprises a region with an upper surface provided by a first material and a recess with a high aspect ratio which is surrounded by the upper surface and has a bottom provided by a second material.

21 Claims, 9 Drawing Sheets

OTHER PUBLICATIONS

Miyako Matsui et al., *"Advanced inspection technique for deep–sub–micron and high–aspect–ratio contact holes,"* Proceedings of SPIE, vol. 4689, pp. 584–591 (2002), The International Society for Optical Engineering (SPIE).

Eiichi Goto et al., *"MOL (moving objective lens) Formulation of defective abarration free system,"* OPTIC, vol. 48, No. 3, pp. 255–270 (1977), Wissenschaftliche Verlagsgeselischaff mbH, Suttgart, Germany.

* cited by examiner

METHOD FOR THE ELECTRON-MICROSCOPIC OBSERVATION OF A SEMICONDUCTOR ARRANGEMENT AND APPARATUS THEREFOR

BACKGROUND OF THE INVENTION

1) Field of the Invention

The invention relates to a method for the electron-microscopic observation of a semiconductor arrangement having a topology with a high aspect ratio. The invention further relates to an apparatus for observing such a semiconductor arrangement.

2) Brief Description of Related Art

Structures with a high aspect ratio are usually encountered in semiconductor manufacture. These are, for example, contact holes, trenches, etc.

In order to image semiconductor structures and, in particular, in order to visualize defects in such semiconductor structures during manufacture, electron-microscopic methods are conventionally employed.

A very common method in this respect is to image semiconductor structures by means of a scanning electron microscope "SEM". However, it has been found that it is difficult to image structures with a high aspect ratio by means of a SEM, because secondary electrons which emanate from bottoms of deeper regions of the structures are absorbed by the walls of such structures. As a result, a significant number of such secondary electrons cannot enter the objective of the microscope. Therefore, deeper structures cannot be satisfactorily imaged by means of a SEM.

From U.S. Pat. No. 6,232,787 B1, a method is known wherein a SEM is used to negatively charge upper surfaces of a semiconductor structure to be examined relative to a bottom of a recess which has a high aspect ratio and is surrounded by the upper surface. Due to this charging, artifacts are deliberately generated in the imaging of the semiconductor structure. It can thus be concluded from these artifacts the presence of manufacturing defects of the structure with a high aspect ratio, for example, a hole. This is because the artifacts cause a hole fabricated with a defect to appear in the electron-microscopy image larger or smaller than a hole corresponding to the specification. However, in this respect, it is presumed that each hole has a predetermined hole size which is then compared with the hole size appearing in the electron-microscopic image. However, this method does not provide a satisfactory image of the hole bottom either.

SUMMARY OF THE INVENTION

Accordingly, it is an object of the present invention to provide a method for electron-microscopic observation of semiconductor structures which allows observing structures with a high aspect ratio with increased flexibility.

In particular, it is an object of the invention to obtain substantially artifact-free images of deeper structures and, moreover, to enable a qualification of the finished structures without previous knowledge of the geometry thereof.

Moreover, it is also an object of the invention to provide an electron microscopy system with which such semiconductor structures are advantageously observable.

According to the invention, an electron microscope type is provided for the observation of structures with a high aspect ratio which is referred to among experts as "SEEM" (secondary electron emission microscope).

In a scanning electron microscope (SEM), an image of the object to be examined is obtained in that a finely focused primary electron beam scans the surface of the object and secondary electrons emanating from the object are detected position-independently. The position resolution of the image is obtained here due to the knowledge of the position to which the primary electron beam is directed. In contrast, in a SEEM an entire extended object field under observation is simultaneously illuminated by a correspondingly extended electron beam, and the secondary electrons emanating from this object field are imaged on a position-sensitive detector such that a substantially sharp image of the object field under observation is generated there.

To enable this position-true imaging of the secondary electrons from the object field to the detector, it is necessary to apply in direct proximity to the object a strong electric field substantially normal to the surface of the object, which electric field acts as an attractive field and accelerates the electrons away from the surface. As a result, electrons, such as secondary electrons emitted with a motion component transverse to the surface normal, are prevented from traveling large paths transversely to the surface normal, and, as a result, from producing an excessive and uncompensatable image blur. Due to this strong electric attractive field which is to be applied in a SEEM between sample and SEEM objective, the SEEM has so far merely been used for observing objects which are of substantially planar shape. It was assumed that spatially structured objects cause a local distortion of the attractive field which destroys the desired high resolution of the electron microscope. In particular, a SEEM was considered unsuitable for the observation of semiconductor structures which have a more structured topography so that, due to a peak effect, electric field strengths are generated at edges of the semiconductor structures which comprise field components which are also directed transversely to the normal towards the surface as a whole of a semiconductor wafer and thus prevent a position-true imaging of the emitted electrons on the detector. Particularly high electric fields produced at such edges may even result into electric arc-overs within the semiconductor structures and might even destroy the same.

The inventors have now found out that semiconductor structures with a high aspect ratio can be surprisingly well imaged by means of a SEEM.

The invention is thus based-on the finding that an electron microscope of the type referred to as SEEM is suitable for the observation of semiconductor structures with a high aspect ratio.

Accordingly, the invention starts from a method for the electron-microscopic observation of an object by means of an electron microscope type which comprises an electron microscope of the type referred to as SEEM. This method thus comprises:

providing an electron microscopy optics for imaging secondary electrons which emanate from a spatially extended object field of the object onto a position-sensitive detector, providing an illumination device for emitting a primary energy beam and directing the primary energy beam to at least the object field in order to release secondary electrons therefrom.

The imaging of the object field on the detector is effected in a position-preserving manner, that is, a topology present in the object is imaged on the position-sensitive detector such that from the image obtained by the position-sensitive detector it can be concluded to the positional structure of the object. The primary beam shall not be limited to an electron beam, but shall comprise any type of energy which is suitable to release secondary electrons from the object to be examined, namely, a photon beam or an ion beam, for example.

In this respect, the invention is distinguished in that this method is used to examine a semiconductor structure with a high aspect ratio, such as a structure which comprises an upper surface provided by a first material and a recess which is surrounded by the upper surface and has a high aspect ratio, the bottom of said recess being provided by a second material.

The first material can be different from the second material. However, it is also possible that the first material and the second material both comprise the same material.

A structure with a high aspect ratio in terms of the present application is a structure wherein, in the case of the recess, a ratio of the depth of the recess to a cross dimension of the same is more than 1.5, preferably, more than 4.0, further preferred, more than 10.0 and, still further preferred, more than 15.0.

It has been found that, by means of this method, structures with a high aspect ratio are surprisingly observable. In particular, position-resolved images, for example, of bottom surfaces of such recesses with a high aspect ratio can be obtained as well.

Preferably, the primary energy beam is provided by a primary electron beam, and the method is preferably used here to also examine such structures wherein the first material is substantially electrically non-conductive. In this respect, it is preferred for a kinetic energy of the electrons of the primary electron beam to be adjusted such that the upper surface is positively charged relative to the bottom. In such a charge configuration between bottom and upper surface, an electric field is produced in the recess which forms a continuation of an attractive field applied between an objective of the electron microscopy optics and the upper surface of the structure to be examined. If such a charge configuration were not present, the attractive field would be partly shielded in the recess and could not sufficiently penetrate thereinto down to the bottom of the recess. As a result, this charge configuration provides an electric field also near the bottom of the recess which acts as attractive field and accelerates the secondary electrons emanating from the bottom towards the electron microscopy optics so that also spatial structures at the bottom of the recess can be imaged on the detector in position-resolved manner.

In order to obtain such a charge configuration, the kinetic energy of the electrons of the primary electron beam is preferably adjusted on the basis of the following consideration:

A material which is substantially electrically non-conductive has a secondary electron yield characteristic which, dependent upon the energy of the primary electrons, has a first neutral point and a second neutral point as well as a maximum between the two neutral points. The secondary electron yield $\sigma$ is defined here as the ratio between the primary electrons impinging on the sample and the secondary electrons emanating from the sample.

By the energy of the primary electrons, it is more exactly understood the kinetic impinging energy, that is, the energy at which the primary electrons impinge on the sample surface.

At lower energies of the primary electrons below the first neutral point fewer secondary electrons are released from the object than primary electrons impinge thereon. For this reason, the object is charged negatively. At the first neutral point, substantially as many secondary electrons are released as primary electrons impinge thereon. The object is substantially not charged. At energies between the first and the second neutral points, more secondary electrons are released from the object than primary electrons impinge thereon. For this reason, the object is positively charged. Above the second neutral point, the energy of the primary electrons is so high that they penetrate deeply into the object and release relatively few secondary electrons from the surface regions thereof so that the object is negatively charged.

In order to obtain the positive charge of the upper surface relative to the bottom of the recess, the kinetic energy of the electrons of the primary electron beam is thus preferably set to an energy value which is higher than a corresponding energy value of the first neutral point of the secondary electron yield characteristic of the first material, that is, the material which provides the upper surface.

In terms of the present application, a material which is substantially electrically non-conductive is a semiconductor which, as far as its respective application is concerned, is medium doped. Preferably, it is a semiconductor which, as far as its respective application is concerned, is weakly doped. Further preferred, it is a semiconductor which is substantially undoped and, in particular, a material which is used as insulator in semiconductor manufacture, for example, silicon oxide, silicon dioxide, silicon nitride or the like. Further, in the present context, non-conductors are materials which unintentionally reach the bottom of the recess during the manufacturing process of the semiconductor and obstruct an electric contacting there, such as residues of a photoresist or the like.

In terms of the present application, a substantially electrically conductive material is, for example, a material for manufacturing a conductor line, for example, of a metal, a highly doped semiconductor or also a semiconductor which, as far as its application is concerned, is medium doped.

If the second material, that is, the material of the bottom of the recess is also a substantially electrically non-conductive material, it has a similar secondary electron yield characteristic as has been described above for the first material. However, the two materials can be different from each other, so that the secondary electron yield characteristics of the two materials then differ from each other, for example, in regard of the energies at which the first and second neutral points and the respective maxima occur.

In this respect, it is advantageous for the kinetic energy of the primary electrons to be then set to an energy value at which the secondary electron yield characteristic of the first material is higher than that of the second material.

If, for example, the maximum of the secondary electron yield characteristic of the first material occurs at a higher energy than the corresponding maximum of the second material, the kinetic energy of the primary electrons is preferably set to an energy value which is higher than the energy at which the secondary electron yield characteristics of the two materials intersect. In this energy range the secondary electron yield of the material of the upper surface is higher than that of the material of the bottom of the recess so that a positive charge of the upper surface relative to the bottom of the recess is easily obtained.

As an alternative or in addition to the provision of the primary energy beam by a primary electron beam, the primary energy beam can also comprise a photon beam or/and an ion beam. Photons or ions are also suitable to release secondary electrons from the object under examination which can then be imaged through the electron microscopy optics on the position-sensitive detector.

As the photon beam itself does not apply any charge to the object, the secondary electrons released by the photons from the object cause the object to be positively charged. As a result, by use of a photon beam, it is relatively easy to positively charge regions of the object.

Vice versa, due to their own usually positive charge, the ions of an ion beam contribute to the sample being charged, which can likewise be utilized to obtain a desired charge configuration of the semiconductor structure.

Here, it is preferably provided for that the photon beam impinges transversely to a normal on the upper surface and, in particular, includes an angle of 10° and 80° with the same. As a result, it is enabled that the photon beam impinging obliquely on the upper surface does not impinge on the recess so that the desired positive charge of the upper surface relative to the bottom of the recess can be achieved with ease.

However, it is also possible to direct the photon beam substantially normal to the upper surface so that it also reaches the bottom of the recess. A positive charge of the upper surface relative to the bottom is substantially achieved when the first material and the second material are different from each other.

Preferably, it is further provided for that the electron microscopy optics is able to displace the object field which is imaged on the detector relative to the detector in a plane of the upper surface. This enables to image different regions of the object under observation on the detector without having to displace the object mechanically relative to the detector.

Such an electron microscopy optics is described in the co-pending German patent application DE 101 31 931.2 of the applicant. The full disclosure of this application is incorporated herein by reference.

Moreover, it is advantageous for the electron microscopy optics to comprise an image-preserving energy filter so that the energy of the secondary electrons which are imaged on the detector is selectable. Such an energy filter is known, for example, from European patent application EP 0 218 920 A2. In particular, it is then possible to adjust the image-preserving energy filter such that secondary electrons released from the positively charged upper surface are substantially not imaged on the detector. Accordingly, substantially only secondary electrons are imaged in position-resolved manner on the detector which emanate from the bottom of the recess so that the structures thereof are recognizable in the image read out from the detector with comparatively good quality.

According to a further aspect, an electron microscopy system is provided by the invention which comprises a controller with a memory for storing predetermined settings of values of a lower or/and an upper energy limit of an energy window or/and a kinetic energy of electrons of a primary electron beam.

BRIEF DESCRIPTION OF THE DRAWINGS

Embodiments of the invention are described below in further detail with reference to the accompanying drawings, wherein.

DETAILED DESCRIPTION OF EXEMPLARY EMBODIMENTS

Figure 1:
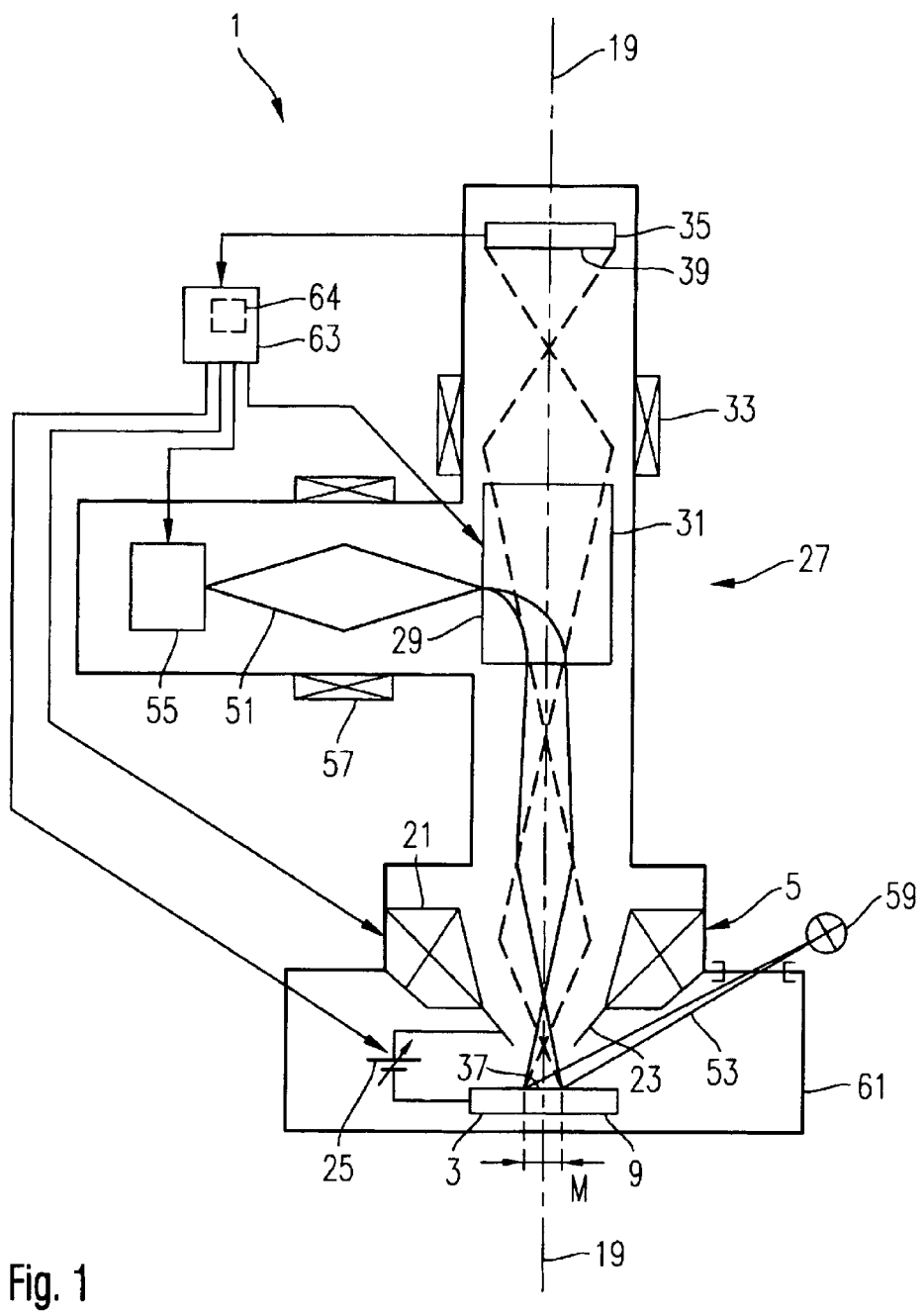
FIG. 1 is a schematic representation of an electron microscope for implementing an embodiment of the method according to the invention.

FIG. 1 schematically shows an electron microscope 1 which is suitable for implementing the method according to the invention. The electron microscope 1 serves to examine a semiconductor structure 3 which is positioned as object to be examined in front of an objective system 5 of the electron microscope 1.

Figure 2:
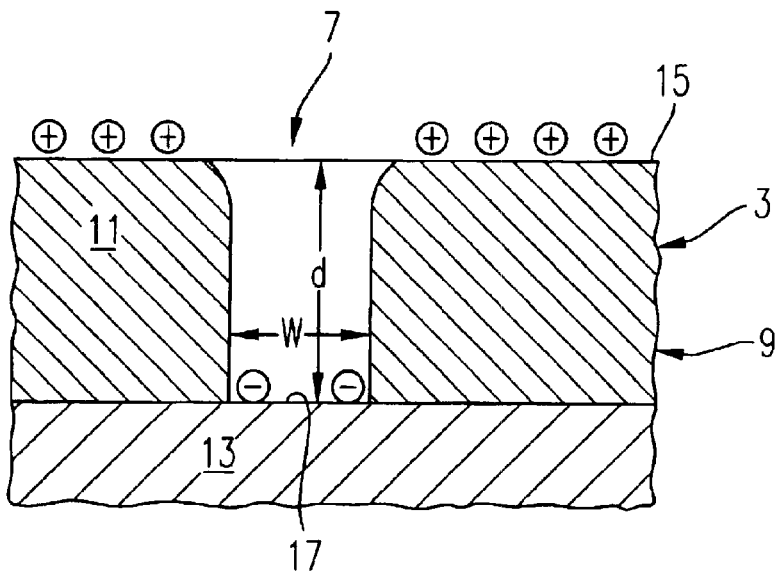
FIG. 2 is a schematic sectional view of a semiconductor structure with a high aspect ratio observed with the electron microscope of FIG. 1.

The semiconductor arrangement 3 constitutes, for example, a part of a semiconductor wafer or the like and has a topology comprising structures with a high aspect ratio, as it is shown schematically in FIG. 2 with reference to a recess 7. The structure 3 shown in FIG. 2 forms part of a semiconductor wafer 9 and comprises a layer 11 of $SiO_2$ of a thickness d of, for example, 2.5 $\mu$m which is deposited on a layer 13 of a metal, such as copper, for example. The $SiO_2$ layer 11 has an upper surface 15 which faces towards the objective system 5 of the microscope 1. The recess 7 is formed in the $SiO_2$ layer 11 and extends from the surface 15 through the $SiO_2$ layer 11 as through hole to the metal layer 13 which forms a bottom 17 of the recess 7. The recess 7 has a dimension w transverse to the upper surface 15 of 250 nm.

The objective system 5 of the electron microscope 1 is substantially symmetric with respect to an optical axis 19 of the objective system 5 and comprises a magnetic winding 21 for generating a focusing magnetic field and an aperture electrode 23 which is held on a positive potential relative to the semiconductor wafer 9 by means of a controllable voltage source 25. However, an electric extraction field can also be applied between the aperture electrode 23 and a displaceable positioning table (not shown) holding the wafer.

The potential between the aperture electrode 23 and the object to be examined with the electron microscope 1, namely the semiconductor arrangement 3, serves to provide an electrostatic attractive field above the surface 15 of the wafer 9 which serves to accelerate secondary electrons emanating from the semiconductor structure 3 towards the aperture electrode so that the secondary electrons pass through this aperture electrode 23 and enter the objective system 5.

The objective system 5 forms part of an electron microscopy optics 27, which further comprises an image-preserving energy filter 31, further magnification optics 33 and a position-sensitive electron detector 35, such as a CCD chip, for example. The electron microscopy optics 27 provided such that a two-dimensionally extended region 37 having a diameter M of 9 μm of the object to be examined is electron-optically imaged substantially sharply on a sensitive surface 39 of the position-sensitive detector 35. This imaging is performed in position-preserving manner, that is, through the electron-optical imaging, there is allocated to each point within the region 37 a corresponding point on the detector surface 39 on which the electrons are imaged which emanate from the semiconductor arrangement 3, at the corresponding point in the region 37.

The secondary electrons emanating from the semiconductor arrangement 3 are thus first accelerated in the direction of the optical axis 19 in the attractive field applied between the wafer 9 and the aperture electrode 23, then enter the objective system 5 and are focused there by the focusing field generated by the magnetic winding 21, while the secondary electrons continue to move in the direction of the optical axis 19. The secondary electrons then pass through the image-preserving energy filter 31 which allows such partial beam of the beam entering the energy filter 31 to pass through which substantially comprises only electrons having a kinetic energy within a limited energy range or energy window, the position information of the electrons imaged by the electron microscopy optics being preserved.

After having exited from the energy filter 31, the electrons selected by the energy filter 31 pass through the further magnification optics 33, which serves to further increase the magnification achievable by the electron microscope 1, before the electrons then impinge on the sensitive surface 39 of the position-sensitive detector 35.

Figure 5:
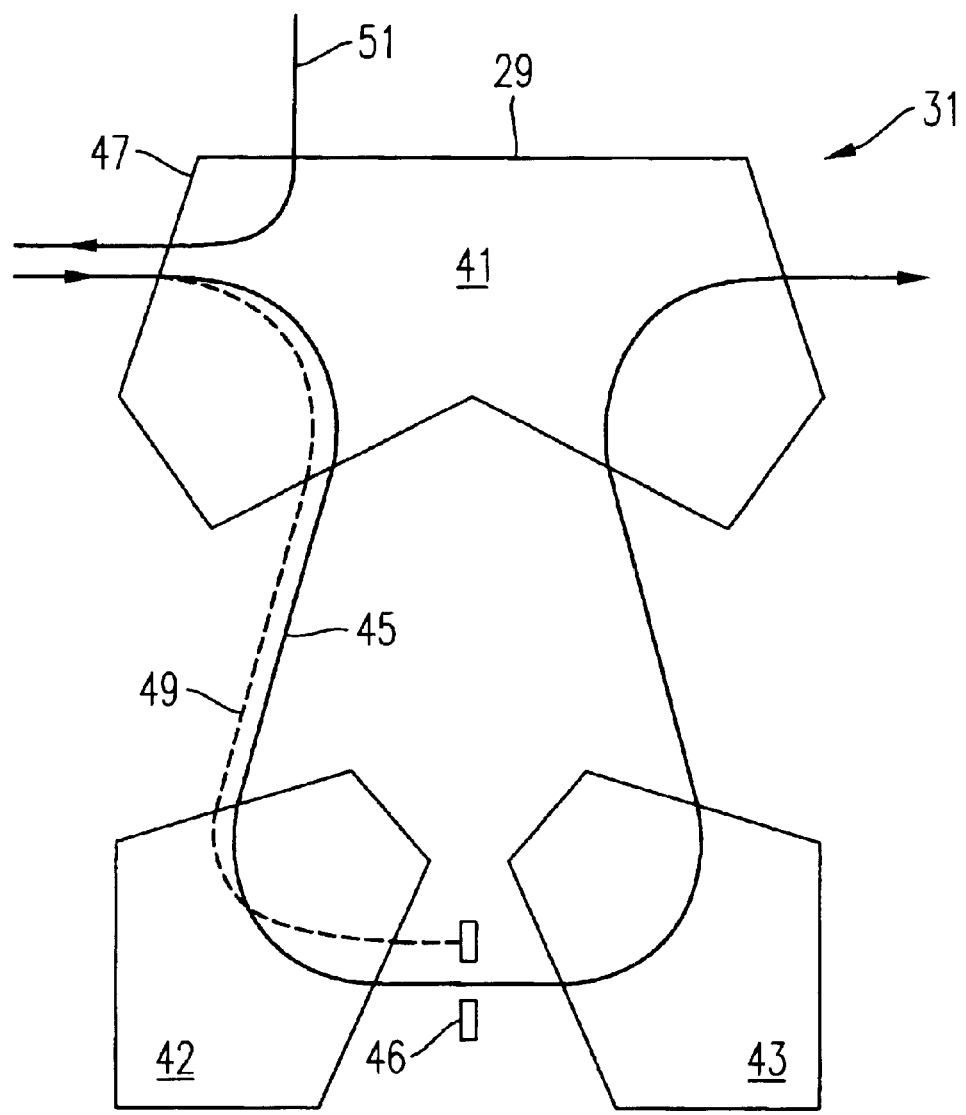
FIG. 5 is a schematic representation of an image-preserving energy filter used in the electron microscope of FIG. 1.

The image-preserving energy filter 31 is schematically shown in further detail in FIG. 5. The energy filter 31 comprises three sector magnets 41, 42 and 43 and an aperture stop 46. The path of the beam through the energy filter 31 is first explained with reference to an electron beam 45, the electrons of which have a first kinetic energy. The electron beam 45 enters the sector magnet 41 at an entrance side 47 and is deflected by the same to the right by an angle of slightly more than 90°. The beam then exits again from the sector magnet 41. Subsequently, the electron beam 45 enters the sector magnet 42, is deflected by the same to the left by an angle of again more than 90° before it exits from the sector magnet 42 to pass through the aperture stop 46. The structure of the energy filter 31 is symmetric with respect to the plane of the aperture stop 46 so that the electron beam, after having passed through the aperture stop 46, is deflected by the sector magnet 43 to the left and then enters again the sector magnet 41 to be deflected by the same to the right such that it exits from the sector magnet 41 in a substantially identical direction in which it had previously entered the same. The sector magnets 41 and 42 cooperate to act as a lens such that a beam crossover is produced in the aperture stop 46, that is, that the beam 45 is substantially sharply focused in the plane of the aperture stop 46.

Electrons which have a lower energy than the electrons of the beam 45 travel on the path designated by 49 in FIG. 5: they are deflected in the sector magnet 41 at a larger angle than the electrons in beam 45 and are then deflected in the sector magnet 42 likewise at a larger angle than the electrons of the beam 45 and, for this reason, exit from the sector magnet 42 offset approximately parallel from the beam 45 and cannot pass through the aperture stop 46.

In order to release secondary electrons from the two-dimensionally extended region 37, an illumination device is provided which supplies energy to the region 37 via a primary energy beam. In the electron microscope 1, this primary energy beam comprises a primary electron beam 51 as well as a photon beam 53.

The primary electron beam 51 is generated by an electron source 55 and first emitted in a direction transverse to the optical axis 19. The kinetic energy of the primary electrons is adjustable by means of a controllable acceleration electrode integrated into the electron source.

The primary electron beam 51 then passes through a focusing optics 57 and enters a part of the energy filter 31 which assumes the function of a beam deflector 29 for the primary electron beam 51. The primary electron beam 51 is deflected by the beam deflector 29 such that it extends along the optical axis towards the semiconductor wafer 9 and is focused by the objective system 5 such that it illuminates the two-dimensionally extended region 37 on the wafer with a substantially uniformly distributed intensity. It is evident from FIG. 5 that the sector magnet 41 of the energy filter 31 forms the beam deflector 29.

The photon beam 53 is generated by a suitable photon source 59 which can be provided by a laser, for example. The photon source 59 can be positioned outside of a vacuum shell 61 in which the semiconductor wafer 9 is positioned in front of the electron microscopy optics 27. The beam 53 passes through the vacuum shell 61 through a suitable window.

A controller 63 is provided for adjusting an energy of the primary electrons 51 emitted by the electron source 55 in order to adjust the voltage provided by the voltage source 25 for generating the attractive field so as to adjust the beam deflector 29 for deflecting the primary electron beam and for deflecting the secondary electron beam in order to set a range of the kinetic energy of the secondary electrons in the energy filter 31 which must comprise secondary electrons to pass through the energy filter 31 and in order for the images read out from the detector 35 to be received.

Figure 3:
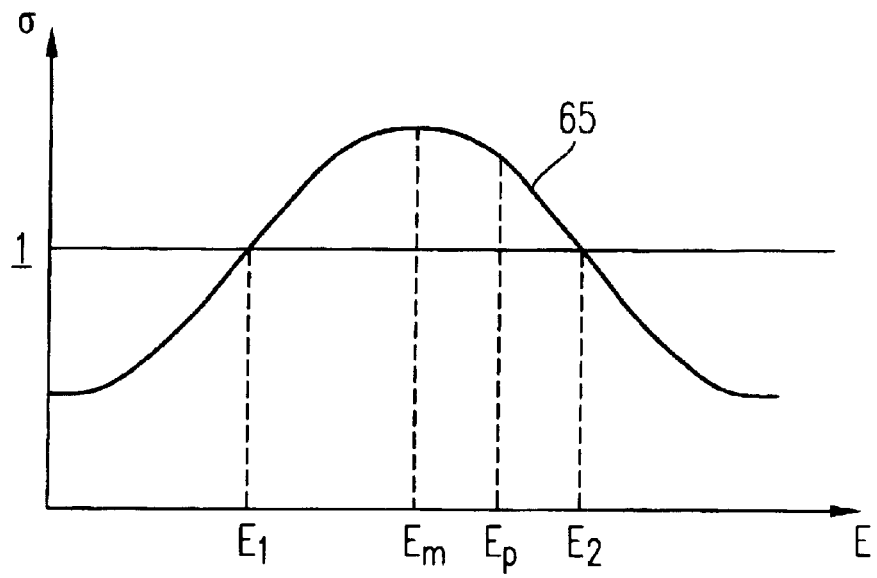
FIG. 3 is a graphical representation of a secondary electron yield characteristic for a material having a structure as shown in FIG. 2.

FIG. 3 shows a secondary electron yield σ for the materials of the semiconductor arrangement 3 shown in FIG. 2 dependent upon the kinetic energy of the primary electrons impinging on the material. For the $SiO_2$ material 11 the secondary electron characteristic is represented by a curve 65.

At primary electron energies below a first neutral point $E_1$, less secondary electrons are released from the material than primary electrons impinge on the same, so that the secondary electron yield is less than 1 and the material is accordingly negatively charged. Above a second neutral point $E_2$, at which the energy is higher than that of the first neutral point $E_1$, there are also less secondary electrons released from the material than primary electrons impinge on the same. Accordingly, the material is also negatively charged at such energies. Between the two neutral points $E_1$ and $E_2$ the secondary electron yield characteristic 65 has a maximum at an energy $E_m$. At such energies, more secondary electrons are released from the material than primary electrons impinge on the same. Therefore, the material is correspondingly positively charged.

The controller 63 adjusts the energy of the primary electrons of the primary electron beam 51 such that the primary electrons impinge on the upper surface 15 of the SiO$_2$ layer 11 with an energy E$_p$ of about 2 keV which lies between the energies E$_m$ and E$_2$.

This results into a positive charge of the surface of the SiO$_2$ layer 11, as it is schematically intimated in FIG. 2.

The primary electrons impinging on the bottom 17 of the metal layer 13 generate a number of secondary electrons which need not necessarily correspond to the number of impinging primary electrons. However, the layer 13 is conductive so that appreciable charges cannot be achieved at the bottom 17. However, the bottom 17 is negatively charged relative to the upper surface 15, because the latter is positively charged. This relative negative charge is likewise schematically shown in FIG. 2.

Figure 4:
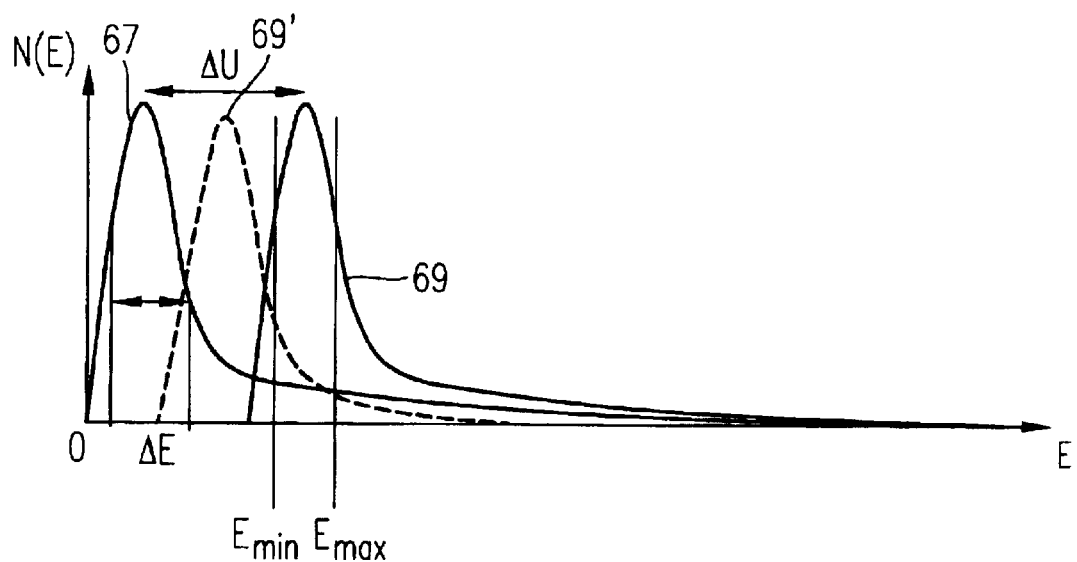
FIG. 4 shows energy spectra of secondary electrons which emanate from the structure shown in FIG. 2.

The negative charge of the bottom 17 relative to the upper surface 15 causes secondary electrons emanating from the bottom 17 to be accelerated already within the recess 7 towards the opening of the recess 7 in the upper surface 15 and pass through this opening already with a kinetic energy which is higher than the kinetic energy at which the secondary electrons emanate from the upper surface 15. This is schematically illustrated in FIG. 4. In this Figure, a curve 67 reflects an energy spectrum of the secondary electrons emanating from the upper surface 15, that is, a number N(E) of these secondary electrons dependent upon the kinetic exit energy E thereof. The curve 67 shows a distinct maximum with a half-field-strength width ΔE.

An energy spectrum of primary electrons emanating from the bottom 17 of the recess 7 would give a curve very similar to curve 67 of FIG. 4. However, due to the different materials of the layer 13 and the layer 11, differences in the course of the spectrum can result. However, the electrons emanating from the bottom 17 of the recess 7 are accelerated by an electric field within the recess which is generated in the recess 7 by the relative negative charge of the bottom 17 relative to the upper surface 15. Accordingly, the electrons emanating from the bottom 17 are accelerated within the recess 7 and exit the recess 7 with a correspondingly higher kinetic energy. The energy spectrum of the electrons emanating from the bottom 17 at the location of the recess at the height of the upper surface 15 is shown in FIG. 4 by a curve 69.

This curve has a course similar to the curve 67. However, it is shifted towards higher energies relative to the curve 67 by an energy amount of ΔU.

The controller 63 can adjust the energy filter 31 such that it substantially allows those electrons to pass which emanate from the upper surface 15 and are represented by the curve 67 in FIG. 4 or that it substantially allows those secondary electrons to pass which emanate from the bottom 17 of the recess 7 and are represented in FIG. 4 by the curve 69.

To this end, the energy filter can be adjusted in a first setting, for example, such that secondary electrons having a kinetic energy which is higher than an adjustable first threshold energy are blocked out. If the first threshold energy is adjusted to lie between the maxima of the two curves 67, 69, preferably those secondary electrons emanating from the upper sample regions 15 which correspond to curve 67 reach the detector 35.

In a possible second setting of the energy filter, wherein secondary electrons with energies lower than the first threshold energy are blocked out, preferably secondary electrons emanating from the bottoms 17 reach the detector 35.

Alternatively, an upper threshold and a lower threshold energy can be provided for the energy filter so that only secondary electrons within such a limited energy range can pass through the energy filter.

The width of the energy range can be adjusted in that a width of the aperture stop 46 (FIG. 5) of the energy filter 31 is changed by mechanically shifting two halves of the stop 46 transversely to the direction of the beam 45. The mechanical shift can be effected either manually or power-operated controlled by the controller 63.

The position of the energy range with an energy width defined by the width of the aperture stop 46 along the energy scale can either be adjusted by changing the magnetic fields provided by the sector magnets 41, 42, 43 controlled by the controller 63. However, it is preferred that this is effected by changing the electric voltage provided by the voltage source 25 between the aperture electrode 23 and the wafer 3. As a result, the strength of the extraction field is changed and thus also the kinetic energy of the secondary electrons after having passed through the aperture electrode 23. The secondary electrons then enter the energy filter 31 with a correspondingly higher or lower energy.

In the memory 64 of the controller 63, there are preferably stored several settings of the primary electron energy as well as the appropriate settings of the energy window, i.e., settings of the voltage source 25, in order to readjust the electron microscope faster from one setting to the other.

With a change of the extraction field, the trajectories of the secondary electrons passing through the energy filter also change between the surface of the object 3 and the aperture electrode 23 as well as further the trajectories of the secondary electrons after having passed through the aperture electrode 23 within the magnetic lens 21. Or, in other words, by shifting the energy window, secondary electrons with different starting energies at the sample are selected for imaging. The objective has a different focusing effect on these secondary electrons with different starting energies.

Although these changes in the trajectories are comparatively small, they nevertheless change a focusing of the electron microscopy optics 27 and thus the imaging quality with which the object is imaged on the detector 35. This change in the focusing caused by changing the extraction field for shifting the energy window of the energy filter 31 is compensated for in that the controller 63 changes the excitation of the magnetic winding 21 of the objective system 5 correspondingly.

In the memory 64 of the controller 63, there are thus furthermore stored, in addition to the different settings of the energy windows, also excitations of the magnetic windings of the objective system 5 in order to be able to quickly change over between different settings of the electron microscope 1.

Figure 6:
FIG. 6 shows a picture of a semiconductor arrangement having structures with a high aspect ratio taken by the electron microscope shown in FIG. 1 at a first setting of an energy filter similar to that shown in FIG. 5.
Figure 7:
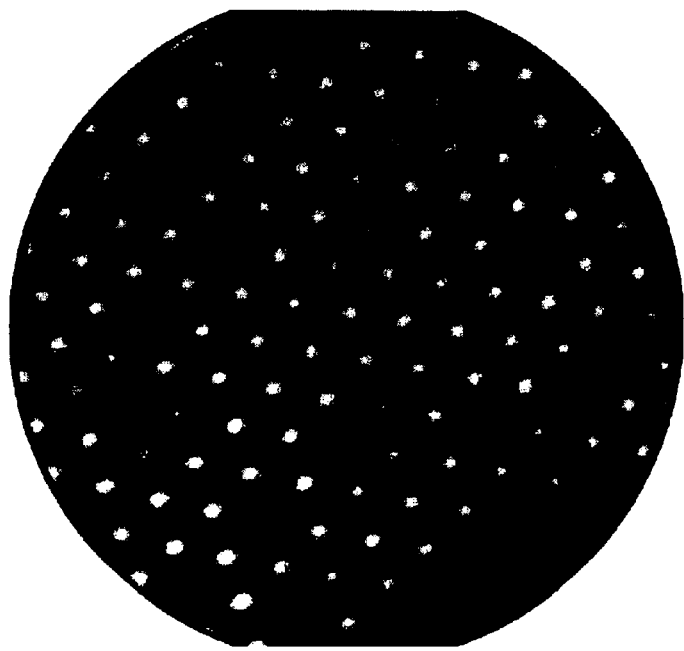
FIG. 7 shows a picture of a semiconductor arrangement having structures with a high aspect ratio taken by the electron microscope shown in FIG. 1 at a second setting of the energy filter shown in FIG. 5.

FIGS. 6 and 7 show electro-microscopic pictures of the wafer 9 obtained with the electron microscope 1 wherein a plurality of recesses 7 are introduced in a hexagonal array.

FIG. 6 shows a picture obtained by the detector 35 with the controller 63 having adjusted the energy filter 31 to the first above-mentioned setting, wherein substantially secondary electrons impinge on the detector 35 which are emitted from the upper surface 15. These are substantially secondary electrons which have a kinetic energy of about 2.5 eV in the plane 15 of the upper surface. Accordingly, for this picture the value E$_{min}$ of the energy window (see FIG. 4) was set to 1 eV and the value E$_{max}$ of the energy window was set to 4 eV. The recesses 7 are visible in the picture as dark spots, however, with low contrast.

FIG. 7 is a picture obtained by the detector 35 with the energy filter 31 having been adjusted to the second above-mentioned setting. Here, substantially those electrons impinge on the detector 35 which have been emitted from the bottom 17. These are substantially those secondary electrons which have a higher kinetic energy of 12.5 eV in the plane of the upper surface due to the effect of the electric field within the recess. Accordingly, for this picture the values $E_{min}$ and $E_{max}$ were set to 11.5 eV and 13.5 eV, respectively. The recesses 7 are thus recognizable in the picture as light regions with good contrast relative to the surrounding upper surface 15.

The controller 63 of the electron microscope 1 shown in FIG. 1 comprises a memory 64 for storing different parameters for the operation of the electron microscope 1 such that it can be quickly changed over between different settings, such as, for example, a setting for the visualization, in particular, of the upper surface 15 according to FIG. 6 or a setting for the visualization of the bottoms 17 of the recesses according to FIG. 7. For each setting, in particular, the lower energy and the upper energy of the energy window of the energy filter 31 and the energy of the primary electron beam 51 are stored. Moreover, further relevant parameters are stored, such as, for example, excitation currents for the focusing optics 57, the magnetic winding 21 of the objective system 5, the further magnification optics 33 or an additional winding of the beam splitter 29.

Figure 8:
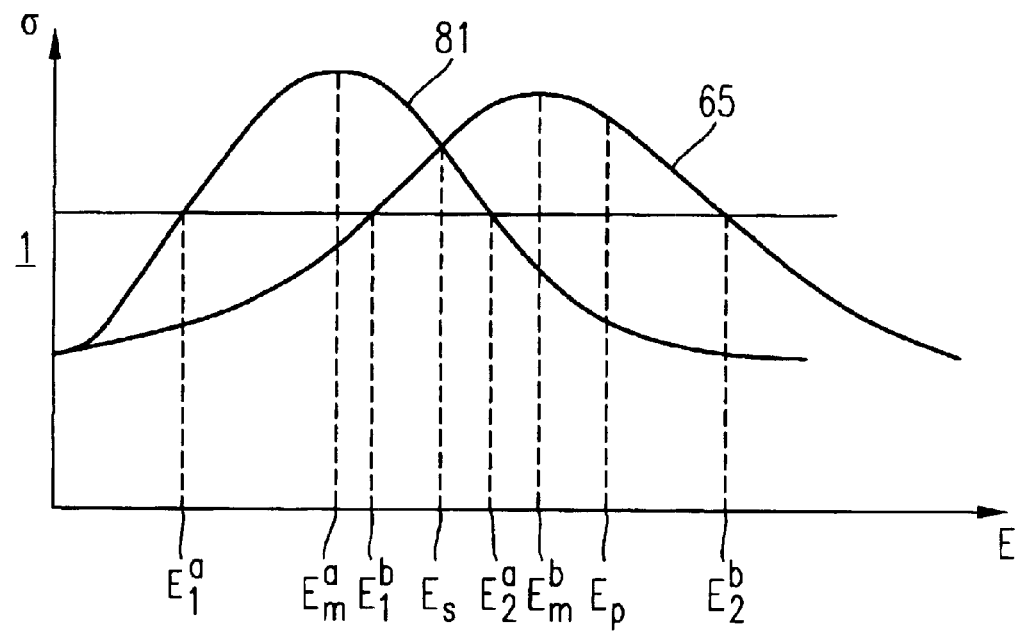
FIG. 8 shows graphs of secondary electron yield characteristics for materials of a semiconductor structure which is similar to the structure shown in FIG. 2.

According to a further embodiment of the invention, the electron microscope 1 shown in FIG. 1 is used to examine a semiconductor wafer 9 having a semiconductor structure 3 which is of similar configuration as shown in FIG. 2. However, the layer 11 and the layer 13 are formed of different materials, both layers being, however, substantially electrically non-conductive. For example, the layer 11 is made of $SiO_2$ and the layer 13 of $Si_3N_4$. The two materials of the layers 11 and 13 exhibit secondary electron yield characteristics as they are shown in FIG. 8 by curves 65 and 81, respectively. Both curves 65 and 81 have first and second neutral points and a respective maximum therebetween, the energies in FIG. 8 which relate to the material of the upper surface being designated by an superscripted letter b and the energies which relate to the material 13 of the bottom 17 being designated by the superscripted letter a. Both curves 81 and 65 intersect each other at an energy $E_s$ which, in the case shown, lies between the two maxima $E_m^a$ and $E_m^b$. At energies which are higher than the energy $E_s$, the curve 65 extends above curve 81. This indicates that the material which provides the upper surface and is represented by the curve 65 is stronger positively charged than the material which provides the bottom and is represented by the curve 81. Accordingly, in this material combination, too, a negative charge of the bottom of the recess relative to the upper surface is achieved. Here, too, an electric field is generated within the recess which accelerates the secondary electrons. Accordingly, in order to observe such semiconductor structure, the energy of the primary electrons, when impinging on the semiconductor structure, is adjusted via the controller 63 and the electron source 55 such that the energy thereof lies above the point of intersection of the curves 65 and 81 at the energy $E_s$. In the described embodiment, the energy $E_p$ of the primary electrons is set to a value between the maximum $E_m^b$ and the second neutral point of the curve 65 at the energy $E_2^b$.

Further variants of the electron microscope described with reference to FIGS. 1 to 8 are described hereinafter which are likewise suitable for implementing embodiments of the method according to the invention. Components which correspond in structure and function to the components shown in FIGS. 1 to 8 are designated by the same reference signs, however, supplemented by an additional letter for the purpose of distinction. Reference is made here to the entire description as well.

In the situation shown in FIG. 8, the energies $E_1^b$, $E_m^b$ and $E_2^b$ of the secondary electron yield characteristic 65 of the material 11 which provides the upper surface 15 are above the corresponding energies $E_1^a$, $E_m^a$ and $E_2^a$, respectively, of the material 13 providing the surface of the recess bottom 17. However, it is also possible that the energies of the material providing the recess bottom 17 are higher than the corresponding energies of the material providing the upper surface. In this case, the kinetic energy of the primary electrons must be adapted accordingly and, in particular, set such that the secondary electron yield of the material 11 providing the upper surface 15 is higher than the material 13 providing the bottom 17 of the recess 7.

Figure 9:
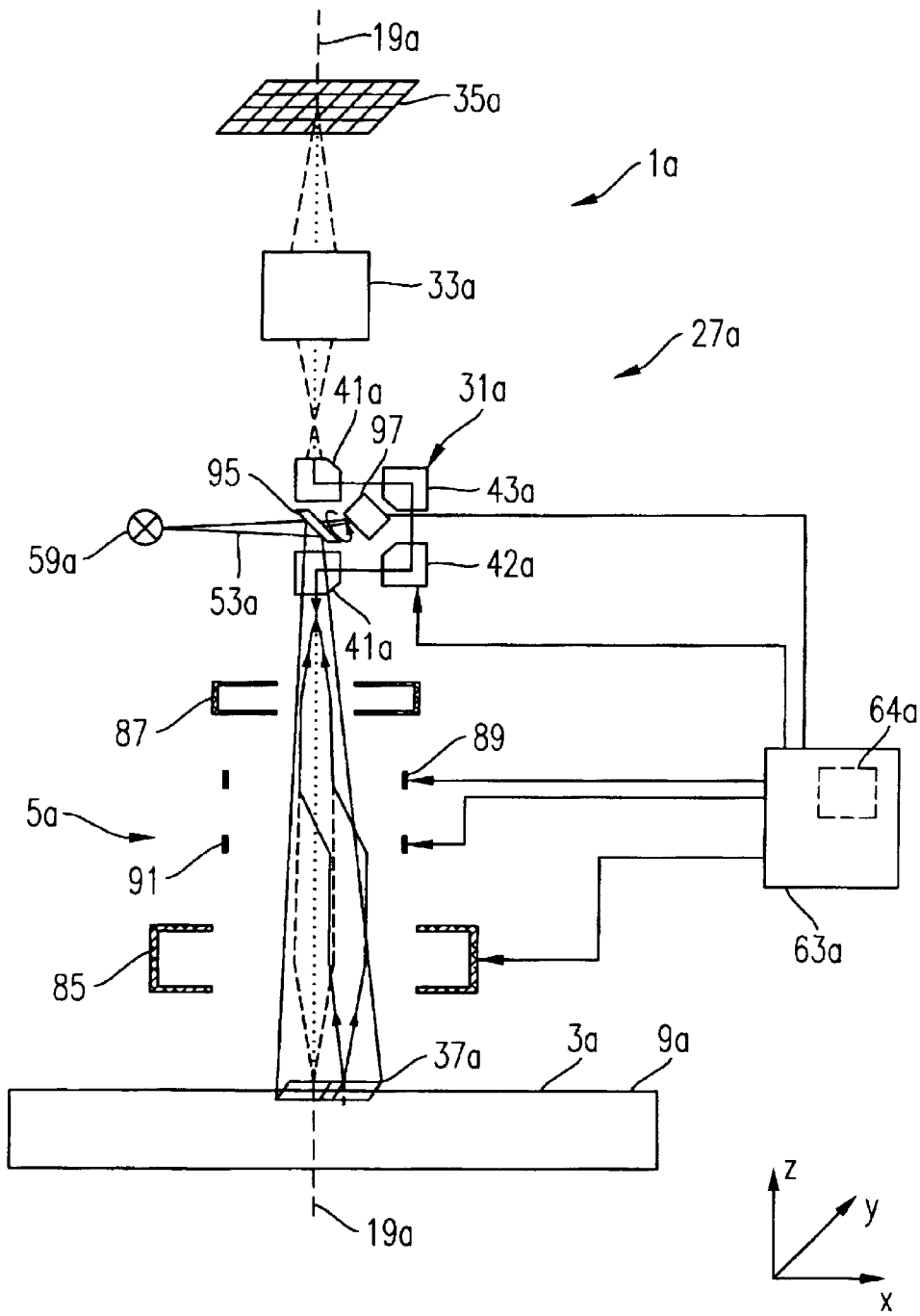
FIG. 9 is a schematic representation of a further electron microscope which is suitable for implementing an embodiment of the method according to the invention.

An electron microscope 1a shown in FIG. 9 is suitable for performing the method according to the invention and is used to image a semiconductor structure 3a on a wafer 9a, the semiconductor structure likewise comprising recesses with a high aspect ration as it has been described with reference to FIG. 2.

The electron microscope 1a comprises an electron microscopy optics 27a which is provided for imaging a region 37a of the surface of the wafer 9a on a position-sensitive detector 35a. The microscopy optics 27a has an optical axis 19a, the components of the microscopy optics 27a which in the beam path are closer to the semiconductor structure 3 than the energy filter 31a being positioned substantially symmetrical in respect of this optical axis. In contrast to the electron microscope shown in FIG. 1, in the electron microscope 1a shown in FIG. 9 the region 37a of the wafer surface imaged on the detector 35a is, however, displaceable with respect to the optical axis 19. To this end, the electron microscopy optics 27a comprises an objective system 5a of two focusing lenses 85 and 87 which cooperate to act as lens doublet, the focusing lens 85 being the focusing lens of the doublet which lies closest to the wafer 9a. Secondary electrons emanating in the region 37a from the wafer thus pass first through the focusing lens 85, then through the focusing lens 87 and further through an image-preserving energy filter 31a which is likewise controlled by a controller 63a for selecting adjustable energies of secondary electrons passing through the energy filter 31a. The secondary electrons selected by the energy filter 31a pass through a further magnification optics 33a, only schematically shown, before they impinge on the detector 35a in order to generate there an electron-microscopic image of the region 37a of the wafer 9a.

Between the two focusing lenses 85 and 87 of the objective system 5a, there are positioned two deflectors 89 and 91 behind each other in the beam path, each deflecting electrons at equal opposite angles so that the two deflectors 91 and 89 cooperate such that an electron beam passing through these two deflectors 89, 91 is displaced parallel by an amount M transversely to the optical axis 19a. The two deflectors 89, 91 are controlled by the controller 63a to adjust the deflecting angle of each deflector and thus also to adjust the parallel beam displacement of the electron beam between entry into and exit from the two deflectors 89, 91. The beam displacement of the secondary electron beam effected by the two deflectors 89, 91 results in that the region 37a of the wafer 9a imaged on the detector 35a is displaceable in the plane of the wafer surface within structurally-induced limits, and thus selectable regions of the wafer surface can be imaged on the detector 35a.

In the electron microscope 1a, a primary energy beam necessary to release the secondary electrons from the wafer surface is provided by a photon beam 53*a* which is generated by a suitable light source 59*a* and directed to the region 37*a* imaged on the detector 35*a*. The photon beam 53*a* is directed on the wafer surface via a reflection at a mirror 94 which is pivotable via a drive 96 controlled by the controller 63*a* for carrying along the region illuminated by the photon beam 53*a* on the wafer surface with the region 37*a* which is imaged on the detector 35*a* and displaceable with respect to the optical axis 19*a* so that it is not necessary to illuminate an excessively large region on the wafer surface with primary energy and the energy supply to the wafer is correspondingly decreased.

Figure 10:
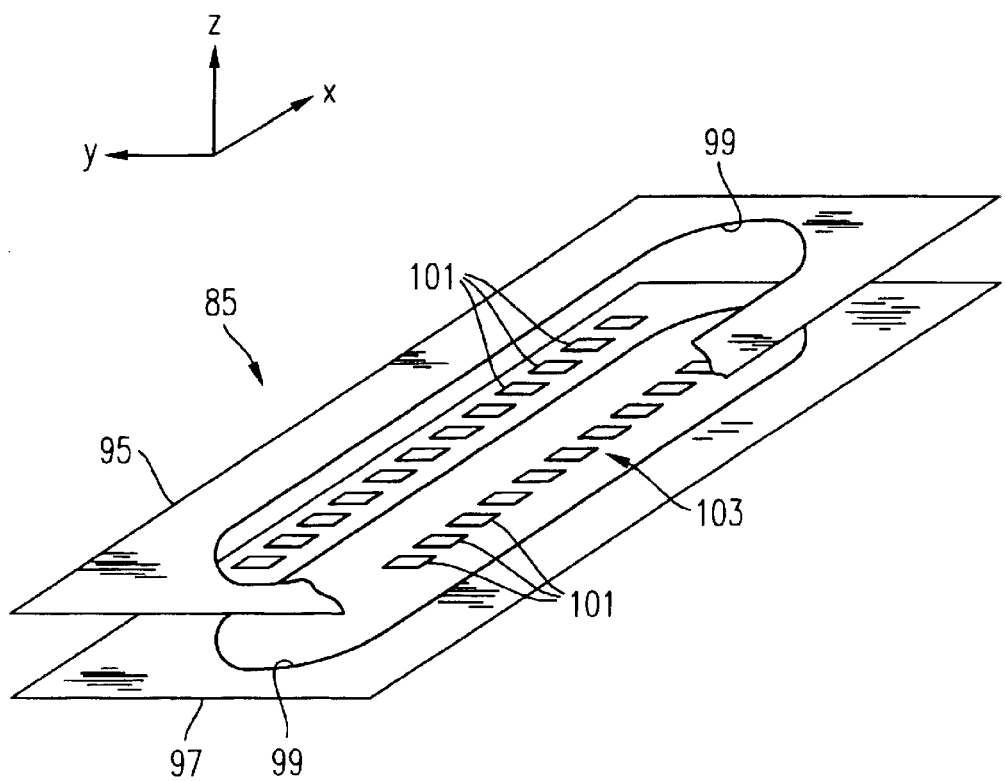
FIG. 10 is a schematic explosion view of an objective system of the electron microscope shown in FIG. 9.

The focusing lens 85 disposed close to the wafer 9*a* is perspectively and schematically shown in FIG. 10. It comprises two planar aperture electrodes 95 and 97 which are oriented orthogonally to the optical axis 19*a* and disposed spaced apart from each other in the direction of the optical axis 19*a*. Each of the aperture electrodes 95, 97 has a slot 99 extending in x-direction for secondary electrons to pass through.

In the direction of the optical axis 19*a* between the two aperture electrodes 95, 97, there are provided two spaced apart rows of finger electrodes 101 which likewise extend in x-direction, the secondary electrons passing through between the two rows. The entirety of the finger electrodes 101 forms an electrode arrangement hereinafter referred to as comb electrode 103. A separately controllable voltage controlled by the controller 63*a* can be applied to each of the finger electrodes 101 and to the two aperture electrodes 95 and 97. In particular, the voltage applied to the aperture electrode 97 or the potential of the aperture electrode 97 relative to the wafer forms the attractive field which is necessary between the objective system 5*a* and the wafer to accelerate the secondary electrons away from the wafer.

Figures 11A, 11B, 11C:
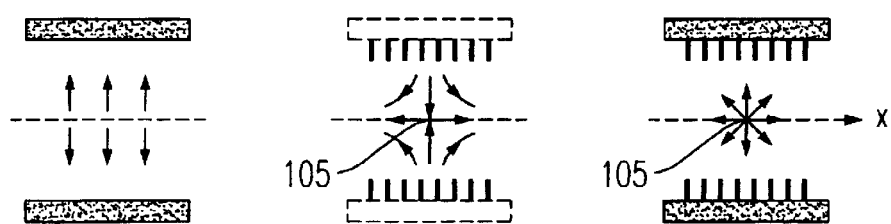
FIG. 11 shows several schematic representations of field configurations to illustrate the function of the objective shown in FIG. 10.

The controller 63*a* applies such a voltage pattern to the finger electrodes 101 that the electric field generated by the finger electrodes 101 has an approximately quadrupole symmetry as it is schematically shown in FIG. 11*b*. By appropriately controlling the finger electrode 101, an axis of symmetry 105 of the quadrupole field can be displaced in x-direction by the controller 63*a*.

On the other hand, the two aperture electrodes 95, 97 each act on the secondary electrodes passing therethrough like a cylinder lens, as it is schematically illustrated in FIG. 11*a*. Accordingly, a superposition of the cylinder lens field according to FIG. 11*a* acts on the secondary electrons passing through the focusing lens 85 as it is provided by the two aperture electrodes 95, 97 and of the quadrupole field according to FIG. 11*b* as it is provided by the comb electrodes 103. This superposition of the electric fields corresponds to a round lens field with an axis of symmetry 105 as it is schematically shown in FIG. 11*c*.

This means that the effect which the focusing lens 85 has on the secondary electrons passing therethrough is that of a focusing round lens, the axis of symmetry 105 of which is displaceable in x-direction by the controller 63*a*.

In operation, the controller 63*a* applies such a voltage pattern to the finger electrodes 101 that the axis of symmetry 105 of the round lens field is displaced away from the axis of symmetry by the same amount M which corresponds to the beam displacement caused by the deflectors 89, 91 in order to displace the field 37*a* on the wafer surface imaged on the detector 35*a*. As a result, the effect of the focusing lens 85 on the secondary electrons emanating from the region 37*a* is substantially independent of the deflection M. As a result, aberrations which are generated by conventional round lens fields for beam paths extending remote from the axis of symmetry of the round lens field are largely avoided.

Figure 12:
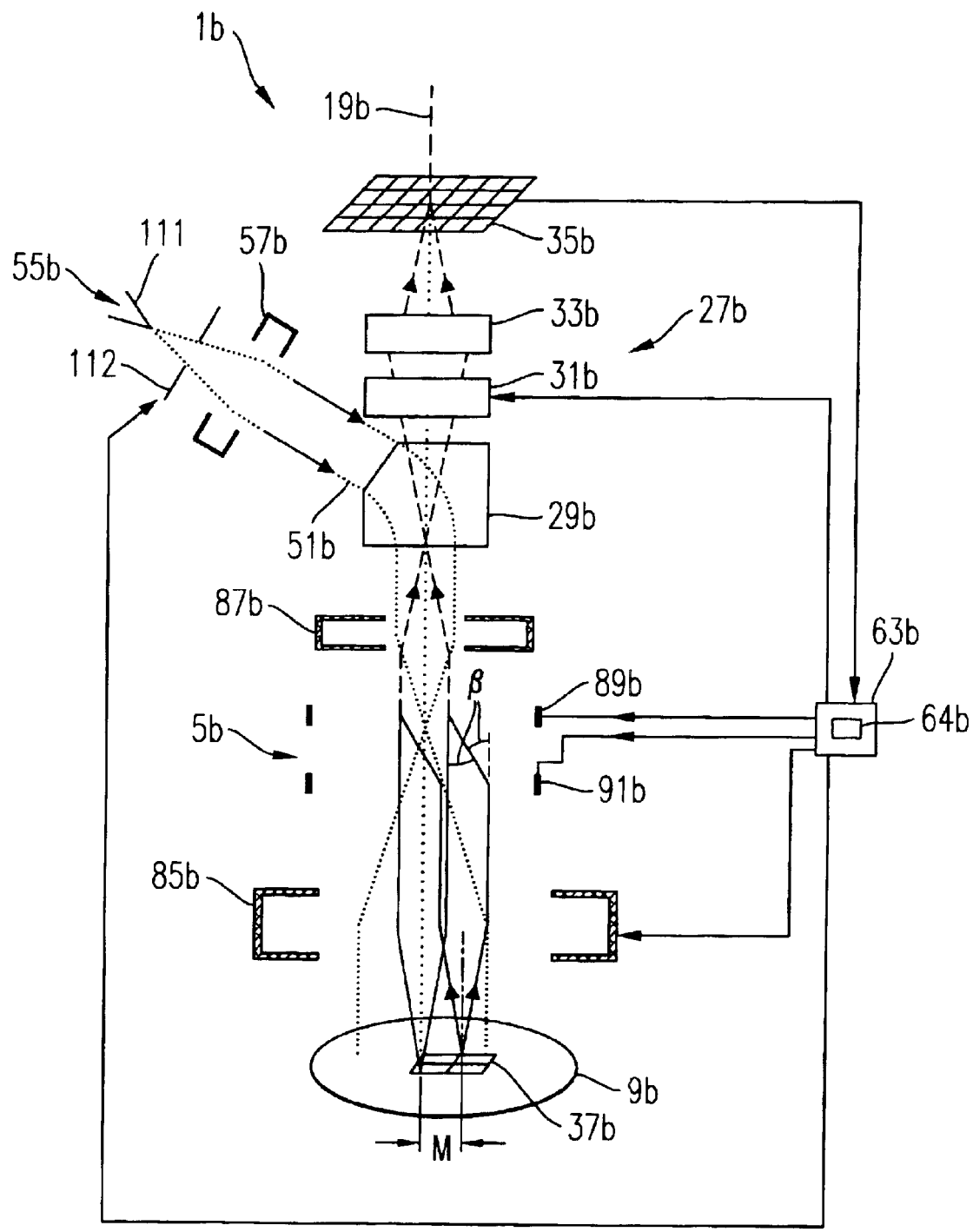
FIG. 12 is a schematic representation of a further electron microscope suitable for implementing an embodiment of the method according to the invention.

FIG. 12 schematically shows an electron microscope 1*b* suitable for performing the method according to the invention which is in structure similar to the electron microscope described with reference to FIGS. 9 to 11.

In contrast to the electron microscope described with reference to FIGS. 9 to 11, in the electron microscope 1*b* shown in FIG. 12 the illumination of a region 37*b* of a wafer 9*b* imaged on a detector 35*b* is not effected by a photon beam but by a primary electron beam 51*b*.

An electron microscopy optics 27*b* for imaging the region 37*b* of the wafer 9*b* on the detector 35*b* again comprises an objective system 5*b* with a focusing lens doublet of focusing lenses 85*b* and 87*b* and a pair of deflectors 89*b* and 91*b* disposed therebetween which cause a beam displacement of the secondary electron beam passing through the lens doublet 85*b*, 87*b* by two successively effected deflections at an angle β each.

The focusing lens 85*b* of the lens doublet which is disposed closest to the wafer 9*b* again comprises an arrangement of aperture electrodes and comb electrodes as explained with reference to FIGS. 10 and 11.

The electron source 55*b* comprises a hot cathode 111 and an anode 112, a voltage between the cathode 111 and the anode 112 being adjustable by the controller 63*a* in order to adjust the kinetic energy of the electrons of a primary electron beam 51*b*. The primary electron beam 51*b* is collimated by a magnetic lens 57*b* and enters a beam deflector 29*b* which provides, for example, electric and magnetic fields oriented transversely relative to each other (Wien filter) so that it finally extends along the optical axis 19*b* towards the wafer 9*b*. The focusing lenses 87*b*, 85*b* and the deflectors 89*b* and 91*b* also act on the primary electron beam 51*b*. The effect produced on the primary electron beam does not exactly correspond to the effect which the components 87*b*, 85*b*, 89*b* and 91*b* have on the secondary electron beam. However, by controlling the deflectors 89*b* and 91*b* and the comb electrodes of the focusing lens 85*b*, the region in which the primary electron beam 51*b* impinges on the wafer is displaced relative to the optical axis 19*b*. Here, other than it applies for the secondary electron beam causing the electron-optical imaging of the region 37*b* on the detector 35*b*, there is no increased requirement to be met by the precision of the effect produced by the controlled components 89*b*, 91*b* and 85*b*, because the primary electron beam merely serves to illuminate the region 37*b*.

Figure 13A:
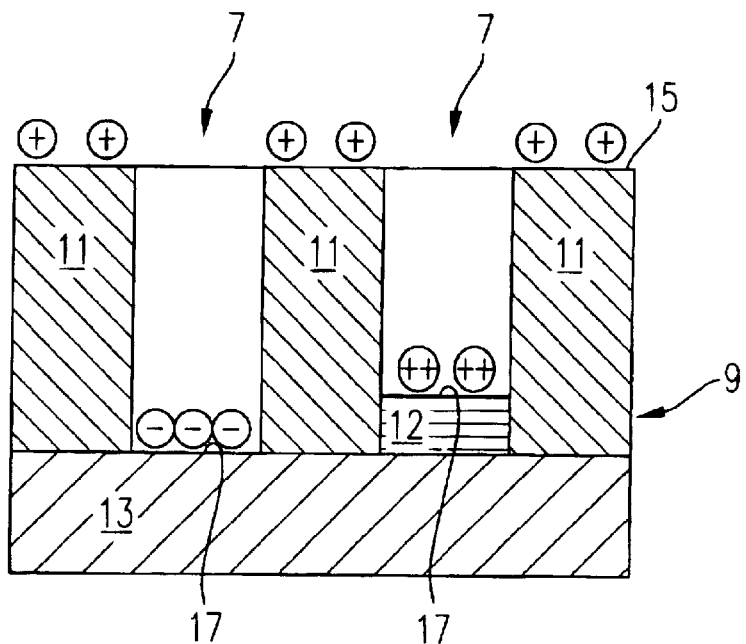
FIG. 13 shows structures with a high aspect ratio and defects to illustrate further embodiments of the method according to the invention.
Figure 13B:
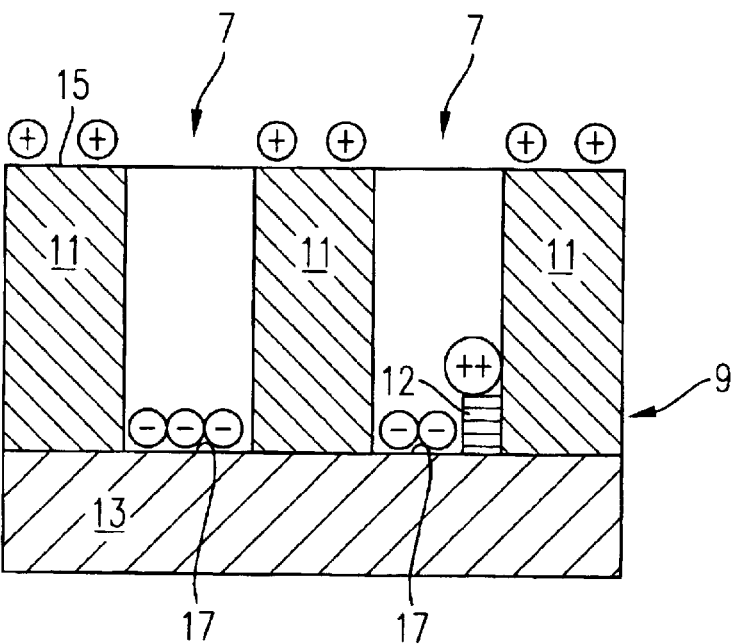

The methods and electron microscopes described above with reference to FIGS. 1 to 12 are used to discover defects in the manufacture of structures having a high aspect ratio. FIGS. 13*a* and 13*b* show examples of such defects. On the left-hand side of each of these Figures, there is shown a flawlessly manufactured recess 7 in a material 11, the bottom of the recess 7 being fully provided by a material 13. On the right-hand side of each of FIGS. 13*a* and 13*b*, there is symbolically shown a recess exhibiting a manufacturing defect. In FIG. 13*a*, the bottom of the recess 7 is fully formed of a defect material 12 which is different from the materials 11 and 13. In FIG. 13*b*, the bottom of the recess is provided merely partially by a defect material 12 which is different from the materials 11 and 13.

In FIGS. 13*a* and 13*b*, a relative charge situation is indicated by the symbols "−", "+" and "++". This is due to the fact that the energy of the primary electrons is adjusted such that the upper material 11 is positively charged relative to the material 13 of the flawless bottom of the recess 7 and, moreover, the defect material 12 is positively charged relative to the material 11 providing the upper surface.

In the situation shown on the right-hand side of FIG. 13b, it is evident that the positive charge of the defect material 12 has an influence on the potential curve within the recess 7 such that an electric field accelerating secondary electrons out of the recess is reduced. Accordingly, secondary electrons emanate from the bottom 17 of the recess with a lower kinetic energy than it is the case in the flawless recess 7 on the left-hand side of FIG. 13b.

If in FIG. 4 the curve 69 reflects the energy distribution of the secondary electrons emanating from the bottom of the flawless recess 7, FIG. 4 indicates an advantageous selection of the energy window with the energies $E_{min}$ and $E_{max}$.

FIG. 4 further indicates in dashed line a curve 69' which reflects the energy distribution of the secondary electrons emanating from the bottom of the defective recess of FIG. 13b. Due to the less accelerating field within the recess 7, the curve 69' is shifted towards lower energies as compared to the curve 69. In the indicated selection of the energy window ($E_{min}$, $E_{max}$), the defect material 12 in the recess thus causes a reduction of the secondary electron intensity within the energy window ($E_{min}$, $E_{max}$) so that flawless recesses can be distinguished from defective recesses according to FIG. 13b, that is, recesses the bottom 17 of which is partially covered with defect material.

In the situation shown in FIG. 13a, the bottom 17 of the recess is positively charged relative to the upper surface 15 and an electric field is produced within the recess 7 which prevents secondary electrons from leaving the recess 7. Accordingly, only few secondary electrons leave the recess.

If the material 13 of the bottom is an electrically conductive material and the material 11 of the upper surface and the defect material 12 are each non-conductors, it is advantageous for the kinetic energy of the primary electrons to be adjusted such that the secondary electron yield of the material 11 is higher than 1 and, moreover, the secondary electron yield of the defect material 12 is higher or equal to the secondary electron yield of the material 11.

Moreover, it is also advantageous for the kinetic energy of the primary electrons to be adjusted such that the secondary electron yield of the material 11 is less than 1 and, moreover, the secondary electron yield of the defect material 12 is lower than or equal to the yield of the material 11.

If the material 13 providing the bottom 17 is, moreover, a non-conductor, it is advantageous for the kinetic energy of the primary electrons to be adjusted such that the secondary electron yield of the material 11 is higher than that of the material 13 and, moreover, the secondary electron yield of the material 12 is higher than or equal to that of the material 11.

In this respect, it is, moreover, likewise advantageous for the kinetic energy of the primary electrons to be adjusted such that the secondary electron yield of the material 11 is lower than the secondary electron yield of the material 13 and, moreover, the secondary electron yield of the defect material 12 is lower than or equal to the secondary electron yield of the material 11.

All of the above-mentioned settings and the associated settings of the energy window of the energy filter as well as of the other components of the electron microscope are advantageously stored in the memory 64 of the controller 63 in order to quickly change over between the different operating modes of the electron microscope and to obtain correspondingly representative images of the semiconductor arrangement under examination, with different types of defects of the recesses or flawless recesses being easily determinable from different images.

In the above-described electron microscopes of FIGS. 1, 9 and 12, electron beams and photon beams have been used for providing the primary energy beam. However, it is also possible to use ion beams for this purpose. In particular, it is also possible to use an ion beam for producing the secondary electrons which is continued to be used in another operating mode of the electron microscope for processing the semiconductor material, for example, for producing cuts therein.

Due to its beam path, the image-preserving energy filter described with reference to FIG. 5 has a so-called $\Omega$-type structure. However, it is also possible to use alternative types of energy filters. One example in this respect is an energy filter referred to among experts as $\alpha$-type.

In the electron microscopes described with reference to FIGS. 9 and 12, the focusing lens disposed closest to the wafer comprises a comb lens as described with reference to FIGS. 10 and 11. This focusing lens is able to displace the axis of symmetry of its focusing lens effect in an x-direction transversely to the wafer surface. However, it is also possible to achieve this function by another lens type. An example for this is a magnetic focusing lens as it is described in the article "MOL" ("Moving objective lens")", Optic 48 (1997), pages 255 et seq., by E. Goto et al. or in U.S. Pat. No. 4,376,249. A preferred embodiment of such a magnetic focusing lens with variable axis is described in German patent application DE 100 44 199.8, the full disclosure of which is incorporated herein by reference.

The present invention is not limited to the embodiments described above. Variations and modifications will occur to those skilled in the art that do not depart from the scope of the invention as recited in the claims appended hereto.

What is claimed is:

1. A method of electron-microscopic observation of a semiconductor arrangement, comprising:
    emitting a primary energy beam from an illumination device;
    directing the primary energy beam to at least an extended object field for releasing secondary electrons from the semiconductor arrangement; and
    imaging the secondary electrons emanating from the semiconductor arrangement within the extended object field with an electron microscopy optics onto a position-sensitive detector;
    wherein the semiconductor arrangement comprises a region with an upper surface provided by a first material and a recess which has an aspect ratio higher than 1.5 and which is surrounded by the upper surface and has a bottom provided by a second material,
    and wherein the imaging generates an image of the upper surface and the recess on the position-sensitive detector.

2. The method according to claim 1, wherein the aspect ratio is higher than 4.

3. The method according to claim 1, wherein the aspect ratio is higher than 10.

4. The method according to claim 1, wherein at least one of an energy and an intensity of the primary energy beam is adjusted such that the upper surface is positively charged relative to the bottom.

5. The method according to claim 1, wherein the illumination device comprises an electron source and the primary energy beam comprises a primary electron beam with an adjustable kinetic energy of electrons of the primary electron beam.

6. The method according to claim 1, wherein the illumination device comprises a photon source and the primary energy beam comprises a photon beam.

7. The method according to claim 6, wherein the photon beam impinges substantially orthogonally on the upper surface of the semiconductor arrangement.

8. The method according to claim 6, wherein the photon beam impinges on the upper surface of the semiconductor arrangement at an angle between 10° to 80°.

9. The method according to claim 1, wherein the electron microscopy optics is provided for displacing the object field which is imaged on the detector relative to the detector in a plane of the upper surface.

10. The method according to claim 1, wherein the electron microscopy optics comprises an image-preserving energy filter which prevents secondary electrons having a kinetic energy which is lower than an adjustable first threshold energy from being imaged onto the detector.

11. The method according to claim 10, wherein the first threshold energy is adjusted such that positively charged electrons released from the upper surface are substantially not imaged on the detector.

12. The method according to claim 11, wherein the energy filter further prevents secondary electrons having a kinetic energy which is higher than an adjustable second threshold energy from being imaged onto the detector.

13. A method of electron-microscopic observation of a semiconductor arrangement, comprising:

emitting a primary energy beam from an illumination device;

directing the primary energy beam to at least an extended object field for releasing secondary electrons from the semiconductor arrangement; and imaging the secondary electrons emanating from the semiconductor arrangement within the extended object field with an electron microscopy optics onto a position-sensitive detector;

wherein the semiconductor arrangement comprises a region with an upper surface provided by a first material and a recess which is surrounded by the upper surface and has a bottom provided by a second material, wherein the illumination device comprises an electron source and the primary energy beam comprises a primary electron beam with an adjustable kinetic energy of electrons of the primary electron beam, wherein, dependent upon the energy of the electrons of the primary electron beam, the first material has a secondary electron yield characteristic with a maximum ($E_m$) and a first neutral point ($E_1$) below the maximum ($E_m$) and a second neutral point ($E_2$) above the maximum ($E_m$), wherein the kinetic energy of the electrons of the primary electron beam is adjusted to an energy value ($E_p$) which is higher than an energy of the first neutral point ($E_1$) of the secondary electron yield characteristic of the first material, and wherein the imaging generates an image of the upper surface and the recess on the position-sensitive detector.

14. The method according to claim 13, wherein at least the first material is substantially electrically non-conductive.

15. The method according to claim 13, wherein the first material is substantially electrically non-conductive and the second material is substantially electrically conductive.

16. The method according to claim 13, wherein the second material, dependent upon the energy of the electrons of the primary electron beam, has a secondary electron yield characteristic with a maximum ($E_m^a$) and a first neutral point ($E_1^a$) below the maximum ($E_m^a$) and a second neutral point ($E_2^a$) above the first maximum ($E_m^a$), and wherein the kinetic energy of the electrons of the primary electron beam is adjusted to an energy value ($E_p$) of an energy range in which the secondary electron yield characteristic of the first material is higher than the secondary electron yield characteristic of the second material.

17. The method according to claim 16, wherein the first and second materials are substantially electrically non-conductive.

18. An electron microscopy system comprising:

a position-sensitive detector arranged at an image plane;

an electron microscopy optics for imaging secondary electrons which emanate within an extended object field from an object on the position-sensitive detector; and an illumination device for directing a primary energy beam to at least the object field for releasing there secondary electrons therefrom, wherein the electron microscopy optics comprises an image-preserving energy filter having an adjustable energy window such that secondary electrons whose kinetic energies are outside of the energy window ($E_{min}$, $E_{max}$) are substantially not imaged on the position-sensitive detector, wherein the electron microscopy system further comprises a controller for adjusting the energy window of the energy filter and a memory for storing at least one setting for the energy window, wherein the illumination device produces as the primary energy beam an electron beam with an adjustable kinetic energy, and wherein the memory is provided for storing a setting of the kinetic energy of the electron beam associated with the setting of the energy window.

19. The electron microscopy system according to claim 18, wherein the electron microscopy optics comprises an aperture electrode for providing an adjustable extraction field for secondary electrons between the object and the aperture electrode, and wherein a storage of the energy window setting comprises a storage of an extraction field setting.

20. An electron microscopy system, comprising:

a position-sensitive detector arranged at an image plane;

an electron microscopy optics for imaging secondary electrons which emanate within an extended object field from a region around an object plane of the electron microscopy optics on the position-sensitive detector;

an illumination device for directing a primary energy beam to at least the object field for releasing there secondary electrons from the object, wherein the electron microscopy optics comprises an image-preserving energy filter having an adjustable energy window such that secondary electrons whose kinetic energies are outside of the energy window ($E_{min}$, $E_{max}$) are substantially not imaged on the position-sensitive detector, wherein the electron microscopy system further comprises a controller for adjusting the energy window of the energy filter and a memory for storing at least one setting for the energy window, and wherein the memory is further provided for storing a focus setting of the electron microscopy optics associated with the setting of the energy window.

21. The electron microscopy system according to claim 20, wherein the electron microscopy optics comprises an aperture electrode for providing an adjustable extraction field for secondary electrons between the object and the aperture electrode, and wherein a storage of the energy window setting comprises a storage of an extraction field setting.

* * * * *